United States Patent [19]

Malaviya

[11] 4,196,363

[45] Apr. 1, 1980

[54] OPEN COLLECTOR BIT DRIVER/SENSE AMPLIFIER

[75] Inventor: Shashi D. Malaviya, Fishkill, N.Y.

[73] Assignee: International Business Machines Corporation, Armonk, N.Y.

[21] Appl. No.: 934,732

[22] Filed: Aug. 21, 1978

[51] Int. Cl.² .......................... H03K 5/18; H03K 5/20; G11C 7/06
[52] U.S. Cl. .................................. 307/362; 307/358; 307/DIG. 3; 365/175; 365/208
[58] Field of Search ............... 307/356, 358, 362, 363, 307/DIG. 3; 365/104, 175, 196, 207, 208, 211, 212, 242, 243

[56] References Cited

U.S. PATENT DOCUMENTS

| | | | |
|---|---|---|---|
| 3,676,703 | 7/1972 | Gersbach | 307/362 X |
| 3,800,239 | 3/1974 | Callahan, Jr. | 307/DIG. 3 X |
| 3,879,669 | 4/1975 | Moriyasu | 307/358 X |
| 3,979,606 | 9/1976 | Ahmed | 307/362 |
| 4,056,740 | 11/1977 | Schoeff | 307/DIG. 3 X |
| 4,078,261 | 3/1978 | Millhollan et al. | 307/DIG. 3 X |
| 4,099,070 | 7/1978 | Reinert | 307/DIG. 3 X |
| 4,104,547 | 8/1978 | Frederksen et al. | 307/362 |
| 4,114,149 | 9/1978 | Kendall | 307/362 X |

OTHER PUBLICATIONS

Chang, "Low Barrier SBD Pull-Down Driver Current Switch," *IBM Tech. Discl. Bull.,* vol. 20, No. 2, pp. 601–603, 7/1977.
Taub, "Current-Threshold Circuit," *IBM Tech. Discl. Bull.,* vol. 17, No. 3, pp. 750, 8/1974.
Daniels, "Current Detector," *IBM Tech. Discl. Bull.,* vol. 17, No. 10, pp. 2963–2964, 3/1975.
Malaviya, "High Speed Sense Amplifier With Low Impedance," *IBM Tech. Discl. Bull.,* vol. 20, No. 4, pp. 1464–1465, 9/1977.

*Primary Examiner*—Larry N. Anagnos
*Attorney, Agent, or Firm*—Theodore E. Galanthay

[57] ABSTRACT

Disclosed is an improved sense amplifier/bit driver circuit including first and second transistors connected in a current mirror configuration. A bit line connected to a plurality of memory cells is connected to the collector of the first of the two transistors while the second of the transistors provides an output at its collector. A current source is connected to the base regions of both the first and second transistors for supplying current when a bit line is to be selected. Current flow through the second transistor is supplied to additional circuitry including a driver circuit, a clamping circuit and a zero filter circuit. Also disclosed is a reference voltage generator which accurately tracks the sense amplifier circuit and provides a reference voltage at or near the midpoint between a binary 1 and binary 0 level. The sense amplifier substantially senses current rather than voltage and also acts as a high power over driven bit driver.

11 Claims, 4 Drawing Figures

OPEN COLLECTOR BIT DRIVER/SENSE AMPLIFIER

DESCRIPTION

Technical Field

This invention relates to an improved sense amplifier and bit driver for high performance memories, i.e. random access memories and read only stores.

It is an object of the present invention to provide an improved sense amplifier having high performance, low power dissipation, and very small size in integrated circuit form.

Another object of the present invention is to provide an improved sense amplifier having a controlled sense signal with fixed amplification/attenuation of the output from the memory cell.

It is another object of this invention to provide an improved sense amplifier which also is a high power bit driver.

Lastly, it is an object of this invention to provide a sense amplifier/bit driver with instantaneous switching from bit driving mode to a sensing mode of operation.

The low power dissipation object of this invention is achieved by the fact that all unselected sense amplifiers dissipate zero power. Typically, only one of 64 or more sense amplifiers is selected while the others are unselected. Accordingly, a large saving in power results since the known prior art dissipates more power in the numerous unselected sense amplifiers than in the one that is selected.

The objects of high performance are achieved by current sensing rather than voltage sensing, the sense amplifier behaving like an ampmeter rather than a voltmeter. Thus, very little change in voltage is required on the bit line. Hence bit lines which are typically highly loaded (usually capacitively) and therefore slow to move in potential, are sensed very quickly by the ability to sense with a small change in voltage.

The bit driver function of the sense amplifier/bit driver of this invention is provided by the grounded emitter (open collector) configuration with a large base drive to draw very heavy current from the bit line until it is brought down from a more positive state (unselected) to a less positive (selected) state. This contrasts with the prior art where the current available to pull down the bit line is very small whereas the required change in voltage for the purposes of sensing is relatively high.

BACKGROUND ART

Sense amplifiers for semiconductor memories are notoriously well known. An example of the prior art is illustrated in FIG. 1. Such a configuration is usually used for differential sensing of two bit line/bit memory cells. However, it could also be used for single ended sensing of one bit line/bit memory cell in the following manner. Bit line 1 (B/L1) is connected to a plurality of memory cells and to the emitter of transistor TA. Similarly, bit line 2 (B/L2) is connected to a plurality of memory cells and the emitter of transistor TB. Transistor TA has its base connected to a bit drive 1 (BD1) input from the bit decoder. Similarly, a bit drive 2 (BD2) input is connected to the base of transistor TB.

In the event that information from a bit along bit line 1 is to be sensed, input BD1 is brought to an up level conditioning transistor TA on. If the binary information in the memory cell along bit line 1 brought bit line 1 to a down level, then transistor TA will continue to hold the base of transistor TC at the down level and the output at the collector of transistor TC at the up level. Conversely, if the information in the storage cell along bit line 1 caused it to be at an up level, then the collector of TA will be brought to an up level turning transistor TC on and bringing the output at its collector to a down level. The sensing of a memory cell along bit line 2 is performed by bringing the base of transistor TB to an up level and sensing the output at the collector of transistor TD. This single ended sensing example has been described because a single ended sense amplifier is disclosed herein. However, this type of sense amplifier is usually used for differential sensing, and an output is usually provided differentially at the output terminals connected to the collectors of transistors TC and TD.

Sense amplifiers of the type illustrated in FIG. 1 have a number of disadvantages. Most significantly, they generally sense voltage not current. That is, a bit line such as B/L1 connected to the emitter of transistor TA must be brought to an up or down logic level, this logic level being transmitted to the base of transistor TC which, in turn, provides the desire logic level at its output. Since the capacitance on a bit line such as B/L1 is very high, the altering of its voltage level slows down sense amplifier performance. The illustrated prior art sense amplifier also consumes excessive power. These various disadvantages of known sense amplifiers have not been satisfactorily solved by the known prior art.

BRIEF DESCRIPTION OF THE DRAWINGS

In the accompanying drawings forming a material part of this disclosure.

For further comprehension of the invention, and of the objects and advantages thereof, reference will be had to the following description and accompanying drawings and to the appended claims in which the various novel features of the invention are more particularly set forth.

Figures 2, 4:
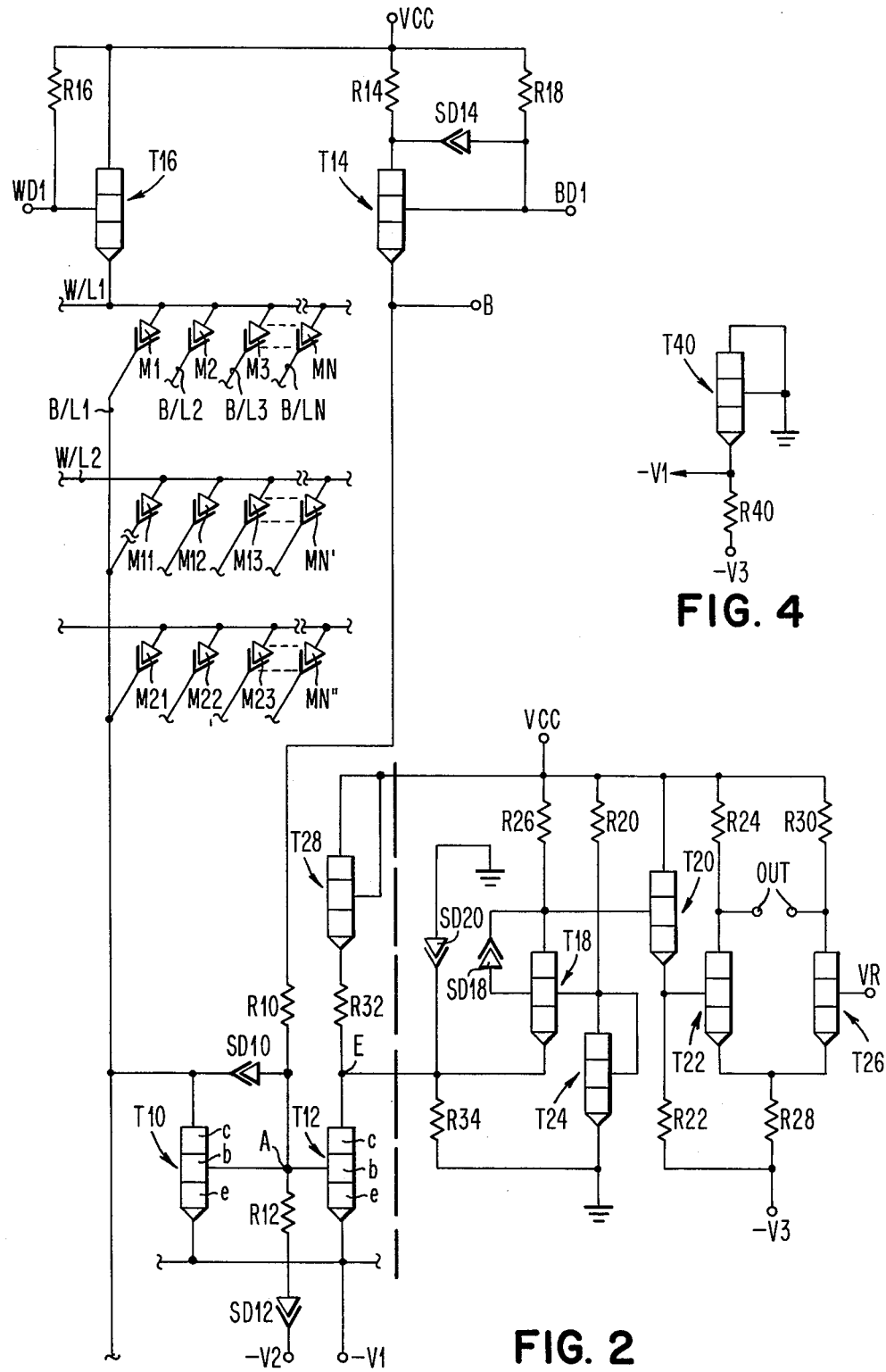
FIG. 2 is a circuit diagram of the sense amplifier of the present invention.
FIG. 4 is a circuit for generating a desired potential level.

FIG. 2 illustrates the sense amplifier of the present invention. In order to simplify the explanation, only a minimal portion of the memory array itself and its associated support circuitry is shown in FIG. 2. Those skilled in the art are quite familiar with the organization of memory arrays, addressing circuits, decoders, and since the details of these are not essential to the understanding of the operation of the present invention, they have been largely omitted.

Memory arrays in general have a plurality of memory cells arranged in a matrix with a plurality of bit lines and word lines arranged orthogonally in order to access the various memory cells within the array. Thus, each bit line (e.g. B/L1) is connected to a plurality of memory cells. The memory cells shown in FIG. 2 are Schottky barrier diodes for a read only memory. It will become apparent, however, that the sense amplifier of this invention is also applicable to random access memories such as flip-flop memory cells, capacitive memory cells, emitter follower memory cells, etc.

In accordance with the present invention, a bit line such as B/L1 is connected to the collector of a first transistor T10 having collector (c), base (b) and emitter (e) regions as shown. Transistor T10 also has a diode clamp illustrated by Schottky barrier diode SD10 connected across its base-collector junction. The emitter of transistor T10 is connected to a first potential level −V1. The sense amplifier further has a second transistor T12 also having collector (c), base (b) and emitter (e) regions, the base and emitter regions being connected in common with the base and emitter regions of transistor T10. A current source is connected to the common node A of the base regions of transistor T10 and transistor T12.

As illustrated in FIG. 2, the current source includes bit line driver transistor T14 and resistors R10 and R14 in a series electrical path between VCC and node A. Transistor T14 is held off when B/L1 is unselected thereby providing a first level of current (e.g. zero current) to node A. When B/L1 is selected, transistor T14 is turned on providing a second level of current (high) to node A. During the off state of transistor T14, node A is biased to a desired level by series connected resistor R12 and Schottky barrier diode SD12 connected in a series path between node A and −V2. The size of R12 can be adjusted so that SD12 can be connected to −V1, thereby eliminating the need for −V1. Alternatively, Schottky barrier diode SD12 can be eliminated and resistor R12 alone can be connected between node A and −V1.

In order to select a desired word line, a conventional word decoder (not shown) turns on a corresponding word line driver. The word decoder 1 output (WD1) is provided as an input to the base of word line driver transistor T16 to drive W/L1 to an up logic level (one VBE below VCC). Transistor T16 is connected as a switch between the positive potential source VCC and word line 1. Resistor R16 is connected between the VCC supply and the base of transistor T16. By way of example, memory elements M1, M2, M3 and MN are connected to word line 1 (W/L1). Similarly, memory elements M11, M12, M13, and MN' are connected to word line 2 (W/L2). Connected to word line N (W/LN) are memory elements M21, M22, M23, and MN". The memory element M1 is also connected to bit line 1. Also connected to bit line 1 is memory element M21. Shown specifically not connected to bit line 1 is memory element M11 to indicate the absence of an information bit in the illustrated read only storage configuration.

Collector load resistance R14 is connected between the VCC supply and the collector of bit line driver transistor T14. Schottky barrier diode SD14 is connected across the base collector junction of T14 as shown. Biasing resistor R18 is connected between the VCC supply and the base of transistor T14. Output terminal B connected to the emitter of transistor T14 permits a drive current to be supplied to other sense amplifiers at their nodes corresponding to the illustrated node A in the event it is desired to simultaneously access a number of bit lines.

Continuing with the description of the sensing configuration, the output at the collector of transistor T12 is connected to the emitter of transistor T18 which has its base to collector junction clamped by Schottky barrier diode SD18. The collector of T18 is connected to the base of transistor T20 which has its emitter connected to the base of transistor T22. The base of transistor T18 is biased to a desired potential by the voltage divider provided by the series path of resistor R20 and diode connected transistor T24 connected in a series path between VCC and ground potential. Resistor R22 is connected between the emitter of T20 and the −V3 supply. Resistor R24 provides a collector load resistance between the VCC supply and the collector of T22. Resistor R26 forms a collector load for transistor T18 between its collector and the VCC supply. The emitters of transistor T22 and transistor T26 are connected in common and to one end of resistor R28, the other end of R28 being connected to the −V3 supply. Resistor R30 forms a collector load resistor for transistor T26 between its collector and the VCC supply. Transistor T26 receives at its base a reference voltage input VR. Thus transistors T22 and T26 form a differential amplifier or current switch and provide a differential output at output terminals C and D.

As will become apparent during the description of the operation of this invention, a zero filter provides a desired offset current at node E. In one form, this zero filter can be a diode connected transistor T28 connected in a series path with resistor R32 between the VCC supply and node E.

Another advantageous feature of the present invention is provided by a DC clamp. As illustrated, this DC clamp includes Schottky barrier diode SD20 connected between ground potential and node E and resistor R34 connected between node E and ground potential. Transistor T26 requires a reference potential input VR at its base. This reference potential is preferably half way between the lowest possible up level and the highest possible down level of the input signal at the base of transistor T22. A stable reference potential that is compensated for process, temperature, and power supply variations is required.

In one form, such a reference voltage generator could sense a zero logic level and provide a reference potential that is a fixed voltage above that. Conversely, a reference voltage generator could sense the binary 1 logic level and provide a reference potential that is a fixed voltage below it. As a third alternative, a reference voltage generating circuit could sense both the binary one and binary zero levels and provide the voltage between these two potentials. A circuit for providing a reference voltage that is midway between a binary 1 and binary 0 logic level is illustrated in FIG. 3.

Figure 1:
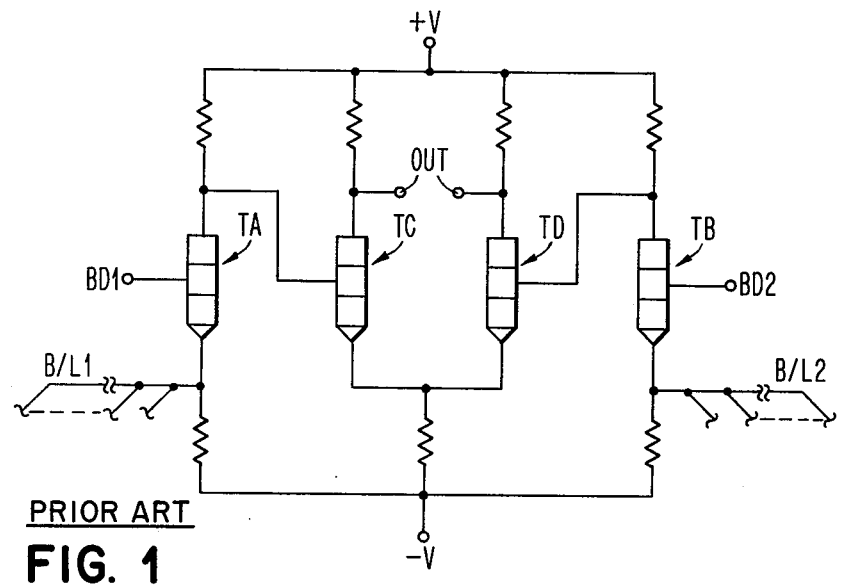
FIG. 1 is a circuit diagram of a prior art sense amplifier.
Figure 3:
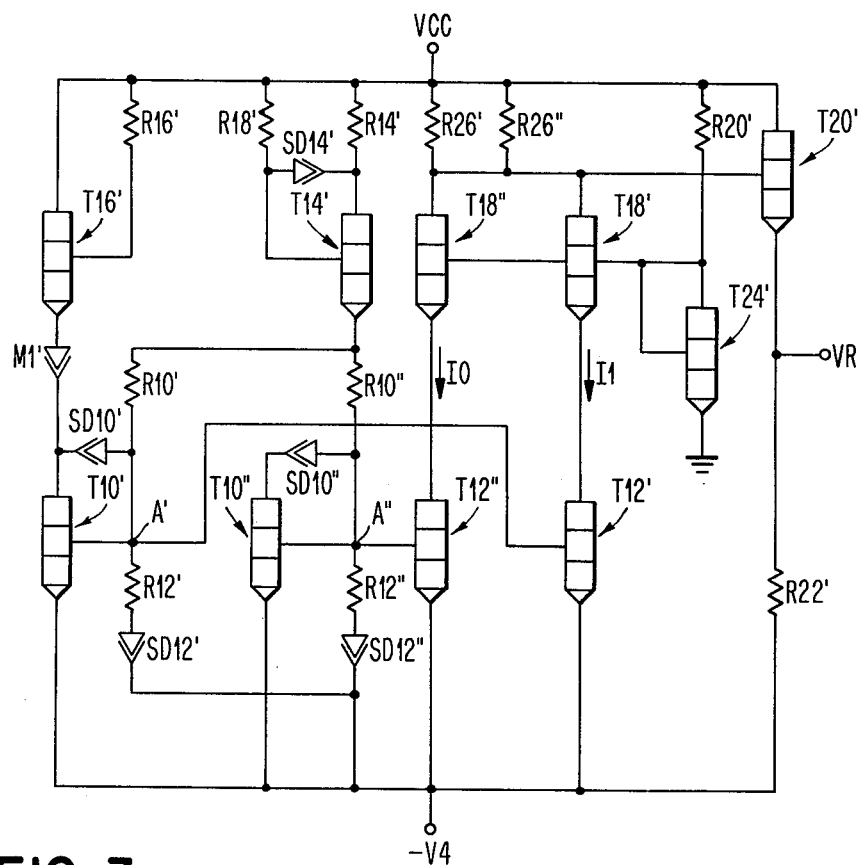
FIG. 3 is a circuit diagram of a reference voltage generator for the sense amplifier of FIG. 2.

Refer now to FIG. 3 for a description of the reference voltage generator. In essence, key components of the sense amplifier circuit of FIG. 2 are replicated in the reference voltage generator of FIG. 3 in order to satisfy the tracking requirements. Thus, in one aspect the circuit of FIG. 3 produces a current equivalent to a binary 0. In another aspect of the circuit of FIG. 3, the current representing a binary 1 is reproduced. As previously mentioned, it is then possible to either offset the referenced voltage with respect to either the binary 0 or 1 value or to average the two for obtaining the midpoint as a reference voltage.

In order to facilitate the description of the circuit of FIG. 3, elements corresponding to those in FIG. 2 have been designated with corresponding reference numerals with prime notation. Thus, the circuit for sensing a binary 1 current includes transistors T10', T12', and T18'. Also included in the circuit for generating the binary 1 current are Schottky barrier diodes SD10', SD12' and resistor R12'. Devices for generating the binary 0 current include transistors T10", T12" and T18". Also included in the circuit for generating the binary 0 current are Schottky barrier diodes SD10", SD12" and resistor R12". The base and emitter regions of T10' and T12' are connected in common and the emitter regions are connected to a −V4 potential. Similarly, the base and emitter regions of transistors T10" and T12" are connected in common, the emitters being connected to the −V4 potential. Transistor T10' has a base to collector Schottky barrier diode clamp CD10' while transistor T10" has a Schottky barrier diode base to collector clamp SD10". The base regions of T10' and T12' are connected to −V4 by means of a series electrical path including a resistor R12' and Schottky barrier diode SD12'. The base regions of T10" and T12" are connected to −V4 by means of a series electrical path including a resistor R12" and Schottky barrier diode SD12". The collector of T12' is connected to the emitter of T18' while the collector of T12" is connected to the emitter of T18". In practice it is desired to limit the number of power supplies so that −V1 and −V4 would usually be the same source.

Transistor T16' has its collector connected to the potential VCC and its base connected to VCC by means of biasing resistor R16'. Schottky barrier diode M1' simulates the corresponding memory element M1 in FIG. 2. The base regions of transistors T10' and T12' are connected to resistor R10' which in turn is connected to the emitter of transistor T14'. Transistor T14' has a base to collector Schottky barrier diode clamp SD14'. Resistor R14' is the collector load resistor for T14' connecting it collector to the VCC supply. The base bias resistor R18' connects the VCC supply to the base of T14'. The emitter of T14' is connected to the base regions of T10" and T12" by means of resistor R10". The common collector connection of transistors T18' and T18" is connected to the VCC supply by means of resistors R26' and R26". The two parallel resistances are shown to illustrate the fact that the resistance value between the collector nodes of T18' and T18" and the VCC supply should be half the resistance of R26 in FIG. 2. Also connected to the collector of transistors T18' and T18" is the base of transistor T20'. T20' has its collector connected to the VCC supply and provides the reference voltage output VR at its emitter which is also connected to resistor R22'. Base bias is provided to transistors T18' and T18" by means of diode connected transistor T24' and resistor R20' which are connected in a series path between VCC and ground potential.

Best Mode For Carrying Out The Invention

The objects and advantageous features of the invention will become more apparent in the description of the operation of the preferred embodiment. Referring again to FIG. 2, assume that the bit decoder provides an up level signal at terminal BD1 turning on transistor T14. The current is limited by resistor R14 and Schottky barrier diode SD14. This current passes through resistor R10 to node A. It is the purpose of R10 to isolate node A from other corresponding nodes of additional sense amplifiers that may be connected to node B. This is the feature that permits several bit lines to be simultaneously accessed, if desired. The current coming into node A is effectively set by the sum of resistances R10 and R14 and may be in the order of, for example, 1 milliamp. This causes node A to move to a higher potential. A portion of the current (e.g. ½ MA) passes through R12 and SD12 to the potential terminal −V2. The remaining current is split evenly between the bases of T10 and T12 providing a base drive of e.g. 0.25 MA to each of these transistors. Transistors T10 and T12 turn on and node A is clamped to one VBE drop above −V1. Assume first the condition in which bit line B/L1 is not selected by the word decoder. Thus, terminal WD1 is held to a down level and transistor T16 is held off. Note that this is the identical case that will occur if word line W/L2 is selected but memory element M11 indicates the absence of a bit. In either case, transistor T10 will tend to pull the bit line to −V1.

It is significant to note at this point that the bit line will be brought to a down level very rapidly. Assuming conservatively that transistor T10 has a β of approximately 50, then the collector current (with a base drive of 0.25 MA) will initially tend to be 12.5 MA to discharge the bit line. Of course, once the bit line discharges, the 12.5 MA could only come through Schottky barrier diode SD12 and since that current is limited (in the present example to 0.5 MA), the T10 collector current stablizes at 0.5 MA. Base drive current to transistors T10 and T12 at this point becomes negligible, with 0.5 MA also being conducted through resistor R12 and SD12.

Since transistor T12 is a current mirror with transistor T10, the same collector current that passes through transistor T10 also passes through transistor T12. Thus, in the absence of a binary 1 condition, a certain low current (e.g. 0.5 MA) is drawn from node E by transistor T12. It is necessary that this current not turn on subsequent stages in the overall sensing configuration. For this reason, a zero filter providing at least the exemplary 0.5 MA must be provided. In the present example, this zero filter is provided by diode connected transistor T28 and resistor R32. Resistor R32 would be set such that approximately 1 milliamp would be supplied to node E, providing a sufficient margin above the 0.5 MA requirement in order to assure that false triggering would not occur. The additional current provided to node E above the current drawn by T12 is conducted to ground by resistor R34. Effectively, diode connected transistor T28, resistor R32 and resistor R34 provide a voltage divider between VCC and ground bringing node E slightly above ground, e.g. to +0.3 volts.

At this point in time, the base of T18 is clamped to 1 VBE above ground potential. Accordingly, as long as the emitter of T18 is above ground potential it is positively held off. This permits the base of T20 to be brought to an up level through resistor R26. This turns on transistor T22 bringing node C to a down level and node D to an up level. Thus, the absence of a binary 1 condition is indicated at the terminals C and D by a down level at terminal C and an up level at terminal D.

Assume next the alternate condition in which the word decoder brings terminal WD1 to an up level turning T16 on. This causes current flow from terminal VCC through transistor T16, through memory device M1 to bit line B/L1. When, as in the previous case, transistor T10 is turned on, this additional current, supplied to bit line B/L1, is additional collector current through transistor T10. Since transistor T12 is connected in a current mirror configuration, this additional value of bit line current will be drawn from node E by transistor T12. This will turn on transistor T18 which will clamp node E to ground potential. The on condition of T18 will turn transistor T20 off which in turn will cause transistor T22 to be turned off and transistor T26 will turn on. In this condition, node C will rise to an up level and node D will be brought to a down level designating a binary 1. Schottky barrier diode SD20 connected between ground potential and node E provides overload protection to prevent node E from being brought below −0.5 volts in the transient state.

As just described, the FIG. 2 circuit provides transistors T10 and T12 as a current mirror such that the current into the collector of T10 is the same as the current into the collector of T12. However, an amplification ratio is readily obtainable by adjusting the relative sizes of the emitters of transistors T10 and T12. For example, if the emitter of T12 is made twice the size of T10 then twice the current will flow through T12 at all times as flows through transistor T10. In the event an attenuation were desired, then the emitter of T10 would be made larger than the emitter of T12.

By way of example, the memory elements have been illustrated as Schottky barrier diodes in a read only store configuration. Thus, memory element M11 would be left unconnected indicating a binary 0 while all the others have been shown connected into a binary 1 configuration. The sense amplifier/bit driver of FIG. 2, however, is equally useful for all other types of memory cells including random access memory cells such as flip-flops. In order to write into a random access memory cell, such as a flip-flop, it is necessary to bring the bit line down quickly. Because of the overdrive feature of the circuit of FIG. 2, this down level of the bit line is obtained very quickly. Also, it is noted that the identical circuit is used for reading and writing, thus it is a true sense amplifier/bit driver.

In the description of FIG. 2, the zero filter circuit including transistor T28 and resistor R32 was described. Of course, more elaborate circuits for providing such a compensating current could be provided. Also, depending on the need for good tracking, etc., the reference voltage VR applied to the base of transistor T26 could be obtained by a simple voltage divider or it could be referenced to ground. For the optimum functioning of the sense amplifier of FIG. 2, however, a reference voltage generator of the type illustrated in FIG. 3 is preferred.

The corresponding devices and connections of FIG. 3 to that of the FIG. 2 circuit were previously described to point out the resultant tracking with respect to process, temperature, and power supply variations. It is noted that the series electrical path from terminal VCC through resistor R14', T14' and R10' will provide the same base drive current at node A' to transistors T10' and T12' as the unprimed components provide at node A to transistors T10 and T12 in FIG. 2. Also, the series current path from terminal VCC through transistor T16' and Schottky barrier diode M1' provides the same current as was provided by transistor T16 and Schottky barrier diode M1 in FIG. 2. This total current flowing into the collector of transistor T10' will flow into the collector of T12' and has been designated as I1. The same base drive current that is supplied to node A' is also supplied to node A''. The collector of T10'', however, is connected only to Schottky barrier diode SD10''. This simulates the condition when the associated bit line is open. Thus, as previously described, a portion of the current (approximately half, for example) flows through resistor R12'' while the other half flows through SD10'' and the collector of T10''. This same current will then flow into the collector of transistor T12''. Since this is the current that flows when a binary 0 or an unselected bit is detected, this current has been designated as I0.

With the I1 current flowing through T18' and the I0 current flowing through T18'', the current flowing through resistors R26' and R26'' must be the sum of the binary 0 and binary 1 currents. A pair of resistors have been indicated to show a resistance value that is half that of resistor R26 in FIG. 2. With the sum of the binary 0 and binary 1 currents flowing through half the resistance, the potential at the base of T20' will be at a potential half way between the binary 0 and binary 1 currents. (It is noted that transistor T24' holds the base electrodes of T18' and T18'' 1 VBE drop above ground, the same potential at which transistor T18 was held in FIG. 2.) With this midpoint voltage applied to the base of transistor T20', the reference voltage provided at terminal VR will be one VBE drop below the midpoint. This will precisely match the level to be traversed by the 1 and 0 signals at the base of transistor T22 in FIG. 2.

It is noted that the reference generator circuit shown in FIG. 3 is consistent with a fan out to another bit driver/sense amp at node B of FIG. 2. For other fan outs, the elements R18', SD14'/T14' and R14' will have to be scaled to maintain identical currents in the resistances R10, R10' and R10''.

A less elaborate scheme for the generation of the reference voltage can be obtained by eliminating substantially half the components in FIG. 3. This could be accomplished by connecting resistors R26' and R26'' to a different voltage rather than VCC. By eliminating all the components associated with generating the binary 1 current, only the binary 0 current would flow through the resistor R26'. By adjusting the potential applied to the upper end of the resistor R26' to a potential level equal to VCC minus a desired incremental voltage, we can get the necessary reference voltage. Conversely, if it were desired to eliminate the elements associated with a binary 0 current, then the upper end of the resistor R26'' would be connected to a potential level equal to an increment above the value of VCC. Finally, the entire reference generator may be dispensed with and the zero filter alone used to improve the output noise margin of the sense amplifier, or any suitable combination of the zero filter and/or the reference generator may be used, as dictated by other design constraints.

It is possible to further improve the sensing scheme by deriving the −V1 supply from a local voltage source. As illustrated in FIG. 4, such a local voltage source includes a transistor T40 used in the diode configuration with its base and collector grounded and emitter returned to −V3 through a resistor R40. The advantages are that −V1 now tracks the VBE drops in the transistors of the sense amplifier and the binary "1" current can be limited by choosing R1 appropriately.

While the invention has been illustrated and described with respect to preferred embodiments, it is to be understood that it is not limited to the precise constructions herein disclosed and the right is reserved to all changes and modifications coming within the scope of the invention as defined in the appended claims.

Having thus described my invention, what I claim as new, and desire to secure by Letters Patent is:

1. An improved sense amplifier comprising:
a bit line connected to a plurality of memory cells;
a first transistor having collector, base, and emitter regions, and a diode clamp across its base-collector junction, said bit line being connected to the collector and the emitter being connected to a first potential level;

a second transistor having collector, base, and emitter regions, the base and emitter regions being connected in common with the base and emitter regions of the first transistor;

a current source connected to the base regions of both said first and second transistors supplying a first level of current when said bit line is to be unselected and a second level of current when said bit line is to be selected; and means connected to the collector of said second transistor for sensing current flow through said second transistor.

2. An improved sense amplifier as in claim 1 wherein said current source comprises:

an active device and an impedance connected in a series electrical path between a second potential level and the base regions of both said first and second transistors.

3. An improved sense amplifier as in claim 2 wherein said active device is a third transistor having collector base and emitter regions and said current source further comprises:

a diode clamp connected across the base collector junction of said third transistor;

an additional impedance connected in a series electrical path between the second potential level and the collector of said third transistor; and said diode clamp and additional impedance limiting the current through said third transistor.

4. An improved sense amplifier as in claim 3 wherein the base of said third transistor is connected to a bit decoder terminal for turning said third transistor on when the bit line is to be selected.

5. An improved sense amplifier as in claim 2 wherein said current source further comprises:

an alternate electrical path connected to the base region of both said first and second transistors, for quickly discharging the base regions of both said first and second transistors.

6. An improved sense amplifier as in claim 5 wherein said alternate electrical path comprises:

a series connected diode and impedance connected between the base regions of both said first and second transistors and a third potential level.

7. An improved sense amplifier as in claim 1 wherein said means connected to the collector of said second transistor comprises:

a zero filter means for providing a current equal to the current drawn by said second transistor when a binary "zero" is sensed.

8. An improved sense amplifier as in claim 7 wherein said zero filter means comprises:

a diode connected transistor and an impedance connected in a series electrical path between the collector of said second transistor and a second potential level; and an additional impedance connected between the collector of the second transistor and a third potential level.

9. An improved sense amplifier as in claim 8 wherein said zero filter means further comprises:

a diode connected between the collector of the second transistor and said third potential level to prevent the saturation of the second transistor in the event of excessive binary "1" current.

10. An improved sense amplifier as in claim 1 wherein said means connected further comprises:

a low impedance current sensing device connected to the collector of the second transistor;

an emitter follower connected to the low impedance current sensing device; and a differential sensing means connected to the emitter follower.

11. An improved sense amplifier as in claim 10 wherein the low impedance current sensing device is a third transistor having collector, base, and emitter regions, the emitter being connected to the collector of the second transistor said means connected further comprising;

a self-compensated base bias means including an additional diode connected transistor and an additional impedance connected in a series path between a second potential level and a third potential level and having a common connection between the collector of said additional diode connected transistor and said additional impedance, said connection being electrically coupled to the base of said low impedance current sensing device.

* * * * *